(12) United States Patent
Kimura

(10) Patent No.: US 7,265,916 B2
(45) Date of Patent: Sep. 4, 2007

(54) MODULE FOR OPTICAL DEVICES, AND MANUFACTURING METHOD OF MODULE FOR OPTICAL DEVICES

(75) Inventor: Toshio Kimura, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 167 days.

(21) Appl. No.: 11/039,813

(22) Filed: Jan. 24, 2005

(65) Prior Publication Data
US 2005/0163016 A1    Jul. 28, 2005

(30) Foreign Application Priority Data
Jan. 27, 2004    (JP)    ............... 2004-019006

(51) Int. Cl.
    *G02B 7/02*    (2006.01)
(52) U.S. Cl. ...................... 359/811; 359/819
(58) Field of Classification Search ........ 359/811–813, 359/237, 244–246, 295, 819; 348/373–376
See application file for complete search history.

(56) References Cited

U.S. PATENT DOCUMENTS

| | | | |
|---|---|---|---|
| 2002/0105591 A1* | 8/2002 | Nakamura et al. .......... | 348/373 |
| 2003/0128442 A1* | 7/2003 | Tanaka et al. .............. | 359/819 |
| 2004/0069998 A1 | 4/2004 | Harazono | |
| 2006/0017128 A1 | 1/2006 | Harazono | |

FOREIGN PATENT DOCUMENTS

| | | |
|---|---|---|
| JP | 2002-182270 | 6/2002 |
| KR | 2003-0029027 A | 4/2003 |
| KR | 2003-0044885 A | 6/2003 |
| KR | 2003-0077390 A | 10/2003 |

OTHER PUBLICATIONS

Patent Abstracts of Japan 2004-004566 dated Jan. 8, 2004.
Patent Abstracts of Japan 2003-116066 dated Apr. 18, 2003.
Lexion Medical, LLC v. Northgate Technologies, Inc., Smith & Nephew, Inc. and Linvatec Corporation, Order, 1:04-CV-5705, in the U.S. District Court for the Northern Distric of Illinois Eastern Division.

* cited by examiner

*Primary Examiner*—Ricky Mack
*Assistant Examiner*—M. Hasan
(74) *Attorney, Agent, or Firm*—Nixon & Vanderhye, P.C.

(57) ABSTRACT

A DSP, which has a through electrode and is stacked to a wiring substrate through an adhesive part, a solid-state image pickup element, which is stacked to the DSP through an adhesive part and has a through electrode and an effective pixel area, and a translucent lid part, which is placed to face the effective pixel area and bonded to the solid-state image pickup element through an adhesive part, are stored in an optical path defining unit with a lens for defining an optical path to the effective pixel area, and the translucent lid part is coupled to the optical path defining unit by a coupling part.

16 Claims, 17 Drawing Sheets

MODULE FOR OPTICAL DEVICES, AND MANUFACTURING METHOD OF MODULE FOR OPTICAL DEVICES

CROSS-REFERENCE TO RELATED APPLICATIONS

This non-provisional application claims priority under 35 U.S.C. §119(a) on Patent Application No. 2004-19006 filed in Japan on Jan. 27, 2004, the entire contents of which are hereby incorporated by reference.

BACKGROUND OF THE INVENTION

1. Field of the Invention

The present invention relates to a module for optical devices, which comprises a solid-state image pickup element and an optical path defining unit for defining an optical path to an effective pixel area formed in one surface of the solid-state image pickup element, and also relates to a manufacturing method of the module for optical devices.

2. Description of Related Art

In recent years, modules for optical devices, which are to be incorporated into optical devices such as digital cameras and mobile phones with camera functions, have been developed (see, for example, Japanese Patent Application Laid Open No. 2002-182270).

FIG. 1 is a cross sectional view showing the structure of a conventional module for optical devices. In FIG. 1, the reference numeral 30 represents a wiring substrate, and a pattern of conductor wiring 31 is formed on both surfaces of the wiring substrate 30. The conductor wirings 31 formed on both surfaces of the wiring substrate 30 are suitably connected to each other in the wiring substrate 30. A DSP (digital signal processor) 32 is bonded (die-bonded) onto the wiring substrate 30. A spacer 33 that is a sheet of insulating adhesive is bonded onto the flat surface of the DSP 32, and a solid-state image pickup element 34 is bonded onto the spacer 33. Each connection terminal of the DSP 32 is electrically connected to the conductor wiring 31 by a bonding wire 32w, and each connection terminal of the solid-state image pickup element 34 is electrically connected to the conductor wiring 31 by a bonding wire 34w.

A cylindrical lens holder body 35 has a focus adjuster 36 that holds a lens 37 inside one end, and the other end of the lens holder body 35 is bonded to one surface of the wiring substrate 30. Bonded between the lens 37 in the lens holder body 35 and the solid-state image pickup element 34 is an optical filter 38 to which a filter treatment for cutting infrared rays among the incident rays was applied. The focus adjuster 36 is screw-fitted into the lens holder body 35, and the position of the focus adjuster 36 with respect to the lens holder body 35 is changed by turning the focus adjuster 36. By using the one surface of the wiring substrate 30 to which the lens holder body 35 is bonded as the basis, the position of the lens 37 is determined by the lens holder body 35 and focus adjuster 36 (hereinafter referred to as the lens holder).

The size (particularly a dimension in the thickness direction) of the wiring substrate 30 of the module for optical devices is within the specification values. However, the wiring substrate 30 is curved, warped, or the like due to manufacturing irregularities. Moreover, even after the lens holder body 35 is bonded, the wiring substrate 30 is still warped, curved, etc. In other words, when positioning the lens 37, there is a possibility that the optical length from the lens 37 to the solid-state image pickup element 34 may not agree with the focal length f of the lens 37 due to the warp and curve of the wiring substrate 30 functioning as the positioning basis.

FIG. 2 through FIG. 4 are explanatory views showing the problems of the conventional module for optical devices, and each figure shows a cross section of the module for optical devices.

FIG. 2 shows a state of the wiring substrate 30 in which the center portion is raised. The lens 37, the center portion of the wiring substrate 30 and the solid-state image pickup element 34 disposed on the center portion of the wiring substrate 30 are kept parallel to each other, but since both ends of the wiring substrate 30 are lower than the center, the lens holder body 35 bonded to the wiring substrate 30 is in a state of being moved down relative to the center portion of the wiring substrate 30. In short, the basis of positioning the lens 37 is moved down. Consequently, the optical length between the lens 37 and the solid-state image pickup element 34 differs from the focal length f of the lens 37, and becomes f−Δf (Δf is the deformation in the thickness direction of the wiring substrate 30).

In such a case, in order to make the optical length between the lens 37 and the solid-state image pickup element 34 equal to the focal length f of the lens 37, the optical length between the lens 37 and the solid-state image pickup element 34 is adjusted to the focal length f of the lens 37 by turning the focus adjuster 36. In other words, an adjustment corresponding to the deformation Δf is made by the focus adjuster 36 so as to locate the solid-state image pickup element 34 at the position of the focal length f of the lens 37.

FIG. 3 shows a state of the wiring substrate 30 in which the center portion is depressed. The lens 37, the center portion of the wiring substrate 30 and the solid-state image pickup element 34 are kept parallel to each other, but since both ends of the wiring substrate 30 are higher than the center, the lens holder body 35 bonded to the wiring substrate 30 is in a state of being moved up relative to the center portion of the wiring substrate 30. In short, the basis of positioning the lens 37 is moved up. Consequently, the optical length between the lens 37 and the solid-state image pickup element 34 differs from the focal length f of the lens 37, and becomes f+Δf (Δf is the deformation in the thickness direction of the wiring substrate 30). Therefore, it is necessary to make an adjustment corresponding to the deformation Δf by the focus adjuster 36, and adjust the solid-state image pickup element 34 to the position of the focal length f of the lens 37.

As described above, in the conventional module for optical devices, since the lens holder body 35 is bonded to the wiring substrate 30 by using the wiring substrate 30 as the basis of positioning the lens 37, the optical length between the lens 37 and the solid-state image pickup element 34 sometimes differs from the focal length f of the lens 37 due to irregularities such as the warp or curve of the wiring substrate 30.

As a result, for each module for optical devices, it is necessary to perform an adjustment process for adjusting the optical length between the lens 37 and the solid-state image pickup element 34 to the focal length f of the lens 37, and an expensive facility and a worker are required for the adjustment. Moreover, a skilled worker is required for the adjustment. Further, two mechanical parts, namely the lens holder body 35 and the focus adjuster 36, are necessary as a lens holder, and it is structurally difficult to reduce the size of the lens holder and the size of the module for optical devices. Besides, since the lens holder is a mechanical component, mass production is difficult, and the ratio of the cost of producing the lens holder to the cost of producing the module for optical devices is high, and consequently the production cost is increased.

On the other hand, FIG. 4 shows a case where the plate thickness of the wiring substrate 30 varies depending on locations. As shown in FIG. 4, even when the wiring substrate 30 has different thicknesses at the left and right ends such that the wiring substrate 30 has a thick plate thickness at the right end and a thin plate thickness at the left end, for example, if the wiring substrate 30 has a rectangular shape with a thickness of around 10 mm and the thickness difference between both ends of the wiring substrate 30 is around ±0.01 mm, the plate thickness of the wiring substrate 30 is within the standards.

However, when the lens holder body 35 is bonded to the wiring substrate 30, the lens holder is fixed in a tilted state with respect to the wiring substrate 30 and solid-state image pickup element 34. As a result, the optical axis of the lens 37 and the perpendicular axis of the solid-state image pickup element 34 have a difference of angle θ, and the solid-state image pickup element 34 can not accurately receive incident light passing through the lens 37. In other words, it is impossible to accurately project the image of an object onto the solid-state image pickup element 34.

Further, in the conventional module for optical devices, each connection terminal of the DSP 32 and each connection terminal of the solid-state image pickup element 34 are electrically connected to the conductor wire 31 by the bonding wire 32w and the bonding wire 34w. Therefore, it is necessary to provide a space for the bonding wire 32w, the bonding wire 34w, and the conductor wiring 31 connected to these wires.

More specifically, it is necessary to provide a space capable of wiring the bonding wire 32w and the bonding wire 34w between the DSP 32 and the solid-state image pickup element 34, and between the solid-state image pickup element 34 and an optical filter 38, and it is also necessary to provide a space capable of placing the conductor wiring 31 on the periphery of the DSP 32 and the solid-state image pickup element 34 on the wiring substrate 30. Consequently, the size of the module for optical devices, for example, distance A between an end of the solid-sate image pickup element 34 and the inner wall of the lens holder body 35 is increased, resulting in the large-sized module for optical devices.

BRIEF SUMMARY OF THE INVENTION

The present invention has been made with the aim of solving the above problems, and it is an object of the present invention to provide a small-sized module for optical devices by including an adhesive part for bonding a translucent lid part to a solid-state image pickup element and a coupling part for coupling the translucent lid part and an optical path defining unit together, and forming a through electrode in the solid-state image pickup element, and provide a manufacturing method of the module for optical devices.

Another object of the resent invention is to provide a module for optical devices in a smaller size by using the coupling part for bonding, or making the plane size of the translucent lid part smaller than the plane size of the solid-state image pickup element.

Still another object of the present invention is to provide a module for optical devices, which does not require an adjustment process for making the optical length between a lens and the solid-state image pickup element equal to the focal length of the lens by designing the optical path defining unit to hold the lens.

Yet another object of the present invention is to provide a module for optical devices, which enables a further reduction in the size by including an image processor in which a through electrode is formed.

A module for optical devices according to the present invention is a module for optical devices, including a solid-state image pickup element having an effective pixel area in one surface thereof and an optical path defining unit for defining an optical path to the effective pixel area, and characterized by comprising: a through electrode passing through the solid-state image pickup element; an adhesive part for bonding a translucent lid part placed to face the effective pixel area to the solid-state image pickup element; and a coupling part for coupling the translucent lid part and the optical path defining unit together.

The module for optical devices according to the present invention is characterized in that the coupling part bonds the translucent lid part and the optical path defining unit together.

The module for optical devices according to the present invention is characterized in that the translucent lid part has a smaller plane size than the plane size of the one surface of the solid-state image pickup element.

The module for optical devices according to the present invention is characterized in that the adhesive part includes a photosensitive adhesive.

The module for optical devices according to the present invention is characterized in that a space is formed between the effective pixel area and the translucent lid part, and the adhesive part is formed on a periphery of the effective pixel area on the one surface.

The module for optical devices according to the present invention is characterized in that the adhesive part seals the periphery.

The module for optical devices according to the present invention is characterized in that the optical path defining unit holds a lens placed to face the effective pixel area.

The module for optical devices according to the present invention is characterized in that the solid-state image pickup element is bonded to a flat portion of an image processor bonded to a wiring substrate.

The module for optical devices according to the present invention is characterized in that the through electrode and a through electrode passing through the image processor are connected.

A manufacturing method of a module for optical devices according to the present invention is a manufacturing method of a module for optical devices, including a solid-state image pickup element having an effective pixel area in one surface thereof and an optical path defining unit for defining an optical path to the effective pixel area, and characterized by comprising the steps of: forming a through electrode in the solid-state image pickup element; bonding a translucent lid part placed to face the effective pixel area to the solid-state image pickup element; and coupling the optical path defining unit to the translucent lid part.

According to the present invention, a through electrode is formed in a solid-state image pickup element in the form of a plate having an effective pixel area in one surface thereof. Moreover, a translucent lid part placed to face the effective pixel area and the solid-state image pickup element are bonded together by an adhesive part. Further, an optical path defining unit for defining an optical path to the effective pixel area and the translucent lid part are coupled together by a coupling part.

In addition, according to the present invention, the optical path defining unit and the translucent lid part are bonded together by the coupling part.

According to the present invention, the plane size of the translucent lid part (for example, the projection area with respect to the solid stage image pickup element) is smaller than the plane size (projection area) of the one surface of the solid-state image pickup element. However, the plane size of the translucent lid part needs to be equal to or larger than the plane size of the effective pixel area.

According to the present invention, the adhesive part for bonding the solid-state image pickup element and the translucent lid part includes a photosensitive adhesive. For example, such an adhesive part is formed by hardening an adhesive obtained by mixing a photosensitive adhesive and a thermosetting resin.

According to the present invention, the adhesive part for bonding the solid-state image pickup element and the translucent lid part is formed on the periphery of the effective pixel area on the one surface of the solid-state image pickup element, and the solid-state image pickup element and the translucent lid part are not completely sealed even after they are bonded together, and therefore a space is formed between the effective pixel area and the translucent lid part.

According to the present invention, the adhesive part for bonding the solid-state image pickup element and the translucent lid part is formed on the periphery of the effective pixel area on the one surface of the solid-state image pickup element, and further seals the periphery of the effective pixel area.

According to the present invention, the optical path defining unit holds a lens that is placed to face the effective pixel area in the one surface of the solid-state image pickup element.

According to the present invention, a module for optical devices comprises an image processor with a flat portion to which a solid-state image pickup element is bonded, and a wiring substrate to which the image processor is bonded. For example, the image processor controls the operation of the solid-state image pickup element, receives an electric signal outputted by the solid-state image pickup element through the through electrode, processes the received electric signal, and outputs the processed electric signal to the wiring substrate.

According to the present invention, a module for optical devices comprises an image processor with a flat portion to which a solid-state image pickup element is bonded, and a wiring substrate to which the image processor is bonded. Moreover, the module for optical devices comprises a through electrode passing through the image processor, and the through electrode of the solid-state image pickup element and the through electrode of the image processor are electrically connected. For example, the image processor inputs a control signal for controlling the operation of the solid-state image pickup element into the solid-state image pickup element through the respective through electrodes of the image processor and solid-state image pickup element. Further, the image processor receives an electric signal outputted by the solid-state image pickup element through the respective through electrodes of the solid-state image pickup element and image processor, processes the received electric signal, and outputs the processed electric signal to the wiring substrate through the through electrode of the image processor.

According to the module for optical devices and the manufacturing method of the module for optical devices of the present invention, a through electrode is formed in the solid-state image pickup element having an effective pixel area in one surface thereof. It is therefore possible to mount the solid-state image pickup element on the outside of the module for optical devices, or the electrode, lead (for example, the wiring substrate), etc. inside the module for optical devices, by using the through electrode. As a result, since there is no need to mount the solid-state image pickup element on the wiring substrate by using wiring means such as wire bonding which requires an additional space for wiring, it is possible to realize a small-sized module for optical devices.

Moreover, the translucent lid part placed to face the effective pixel area is bonded to the solid-state image pickup element by the adhesive part. It is thus possible to cover the effective pixel area of the solid-state image pickup element with the translucent lid part. As a result, it is possible to protect the effective pixel area from coming into contact with outside objects, for example. Further, the structure and the manufacturing process become simple by bonding the translucent lid part and the solid-state image pickup element than by coupling the translucent lid part and the solid-state image pickup element by means other than bonding (for example, engagement using a suitable engagement member between the translucent lid part and the solid-state image pickup element).

In addition, the optical path defining unit for defining an optical path to the effective pixel area and the translucent lid part are coupled together by the coupling part. Since the translucent lid part and the solid-state image pickup are bonded together and integrally mounted, it is possible to reduce the size compared with a module for optical devices in which the optical path defining unit and the translucent lid part are mounted individually, or a module for optical devices in which the translucent lid part and the solid-state image pickup element are mounted individually.

According to the module for optical devices of the present invention, the optical path defining unit and the translucent lid part are bonded together by the coupling part. The structure and the manufacturing process become simple by bonding the optical path defining unit and the translucent lid part than by coupling the optical path defining unit and the translucent lid part by means other than bonding (for example, screw fitting), and it is possible to reduce the distance between the optical path defining unit and the translucent lid part and provide a small-sized module for optical devices. Further, in the case where the space between the optical path defining unit and the translucent lid part is sealed by an adhesive, it is possible to protect the solid-state image pickup element from the external environment by sealing it in the optical path defining unit.

According to the module for optical devices of the present invention, the translucent lid part covers the effective pixel area and has a smaller size than the solid-state image pickup element. It is therefore possible to reduce the size of the module for optical devices while keeping the function of protecting the effective pixel area by the translucent lid part, and particularly, if the module for optical devices is a camera module, it is possible to further reduce the size of a camera.

According to the module for optical devices of the present invention, the adhesive part for bonding the solid-state image pickup element and the translucent lid part includes a photosensitive adhesive. Therefore, by forming a pattern of a photosensitive adhesive or an adhesive including a photosensitive adhesive on the solid-state image pickup element or the translucent lid part by a photolithography technique and hardening the adhesive, it is possible to easily, accurately and efficiently form the adhesive part.

According to the module for optical devices of the present invention, the adhesive part for bonding the solid-state image pickup element and the translucent lid part is formed on the periphery of the effective pixel area on the one surface of the solid-state image pickup element. Moreover, the solid-state image pickup element and the translucent lid part are not completely sealed even after they are bonded together, and therefore a space is formed between the effective pixel area and the translucent lid part. As a result, incident light on the module for optical devices only passes through the space before it reaches the effective pixel area after passing through the translucent lid part, and, for example, does not passes through the adhesive part. Suppose that the adhesive part is formed between the effective pixel area and the translucent lid part. In this case, a loss of light such as attenuation and scattering occurs because the incident light passes through the adhesive part. Thus, the module for optical devices of the present invention is optically advantageous compared to a module for optical devices having the adhesive part on the effective pixel area.

According to the module for optical devices of the present invention, the adhesive part for bonding the solid-state image pickup element and the translucent lid part seals the periphery of the effective pixel area on the one surface of the solid-state image pickup element. Therefore, the adhesive part can close the space between solid-state pickup element and the translucent lid part, and can prevent humidity infiltration and adhesion of dust (scraps of trash, rubbish, etc.) to the effective pixel area. As a result, the reliability of the solid-state image pickup element can be improved, and further the reliability of the module for optical devices can be improved. Besides, after bonding the solid-state image pickup element and the translucent lid part together, there is no need to additionally protect the effective pixel area, and therefore it is possible to simplify the manufacturing process of the module for optical devices and reduce the manufacturing costs.

According to the module for optical devices of the present invention, the optical path defining unit holds a lens which is placed to face the effective pixel area in the one surface of the solid-state image pickup element. Moreover, the optical path defining unit is coupled to the translucent lid part by the coupling part, and the translucent lid part is placed to face the effective pixel area and bonded to the solid-state image pickup element by the adhesive part. Therefore, the translucent lid part can be used as the basis of positioning the lens held in the optical path defining unit.

In this case, it is possible to accurately and precisely secure the positional relationship between the lens and the solid-state image pickup element. In other words, it is possible to precisely control the optical length between the lens and the solid-state image pickup element to agree with the focal length of the lens by using the translucent lid part as the basis, and it is possible to place the lens and the solid-state image pickup element parallel to each other, that is, it is possible to precisely align the optical axis of the lens with the perpendicular axis of the front surface (more specifically the effective pixel area) of the solid-state image pickup element. Further, even when the wiring substrate is deformed, there is no need to adjust the optical length between the solid-state image pickup element and the lens. Besides, even when the plate thickness of the wiring substrate varies, it is possible to align the optical axis of the lens with the perpendicular axis of the solid-state image pickup element. As a result, the image of an object can be accurately projected onto the solid-state image pickup element.

Thus, the module for optical devices of the present invention does not require a focus adjuster which is necessary for a conventional module for optical devices to adjust the optical length between the lens and the solid-state image pickup element, and does not require an adjustment step using a focus adjuster. Moreover, since a focus adjuster is unnecessary, it is possible to reduce the number of component parts and realize a small-sized (thin, light-weight) module for optical devices. Further, since the focus adjustment step using a focus adjuster is unnecessary, it is possible to simplify the manufacturing facility and the manufacturing process, thereby enabling an improvement in the yield, a reduction in the material costs and production costs, and a low price.

According to the module for optical devices of the present invention, the wiring substrate, image processor, solid-state image pickup element, and translucent lid part are stacked by bonding, and the translucent lid part is coupled to the optical path defining unit, and therefore it is possible to realize a small-sized module for optical devices. Moreover, since there is no need to mount the solid-state image pickup element on the wiring substrate by using wiring means such as wire bonding which additionally requires a space for wiring, it is possible to realize a small-sized module for optical devices.

According to the module for optical devices of the present invention, the wiring substrate, the image processor in which a through electrode is formed, the solid-state image pickup element having a through electrode connected to the through electrode of the image processor, and the translucent lid part are stacked by bonding, and the translucent lid part is coupled to the optical path defining unit, and therefore it is possible to realize a small-sized module for optical devices. Moreover, since there is no need to mount the solid-state image pickup element and the image processor on the wiring substrate by using wiring means such as wire bonding which additionally requires a space for wiring, the present invention has advantageous effects, for example, it is possible to further reduce the size of the module for optical devices.

The above and further objects and features of the invention will more fully be apparent from the following detailed description with accompanying drawings.

DETAILED DESCRIPTION OF THE INVENTION

The following description will explain in detail the present invention, based on the drawings illustrating an embodiment thereof. Although this embodiment illustrates a lens-incorporated module for optical devices as an example, the present invention is not limited to this.

Figure 1:
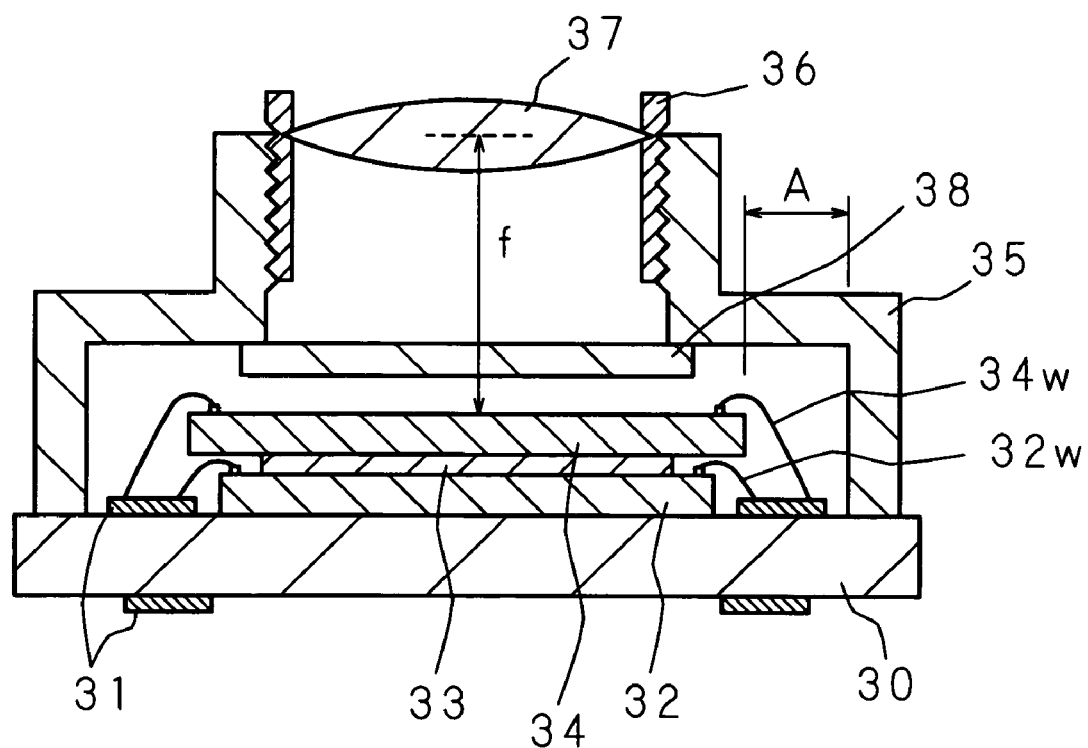
FIG. 1 is a cross sectional view showing the structure of a conventional module for optical devices.
Figure 2:
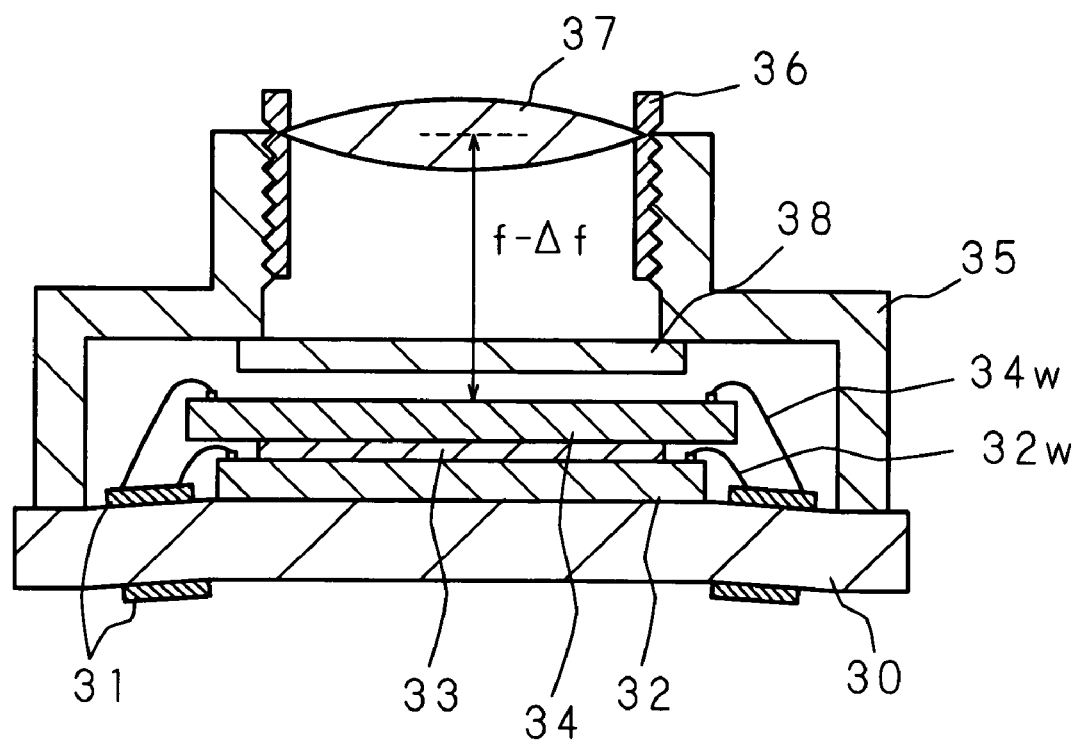
FIG. 2 is an explanatory view showing one problem of the conventional module for optical devices.
Figure 3:
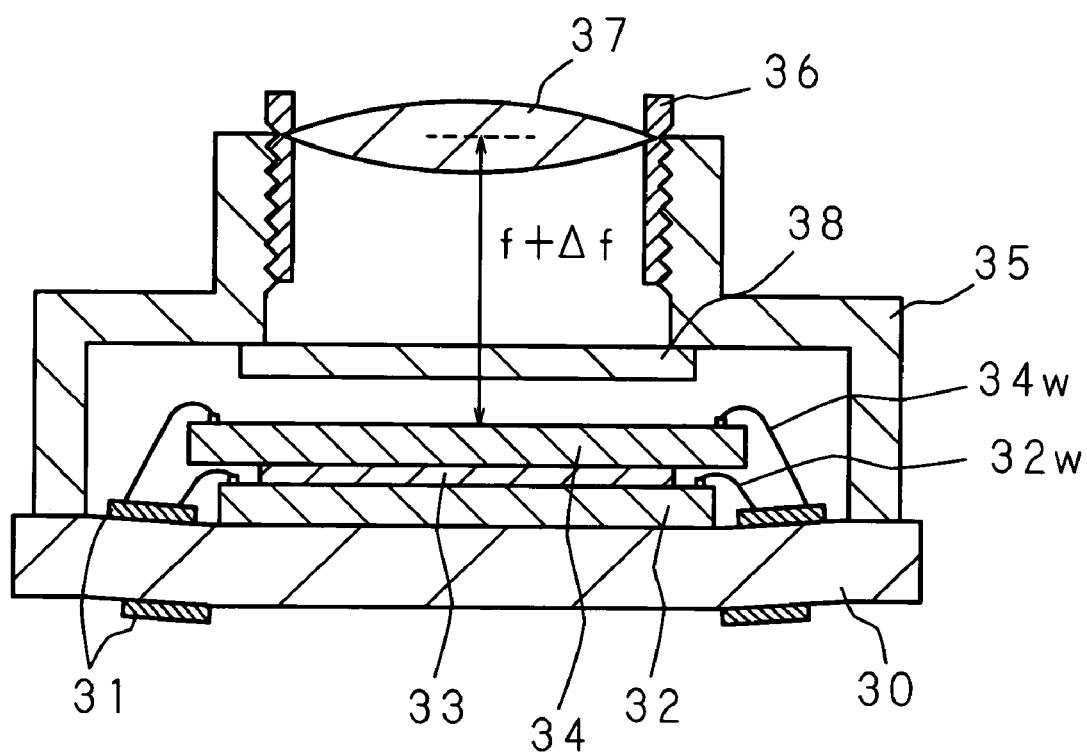
FIG. 3 is an explanatory view showing another problem of the conventional module for optical devices.
Figure 4:
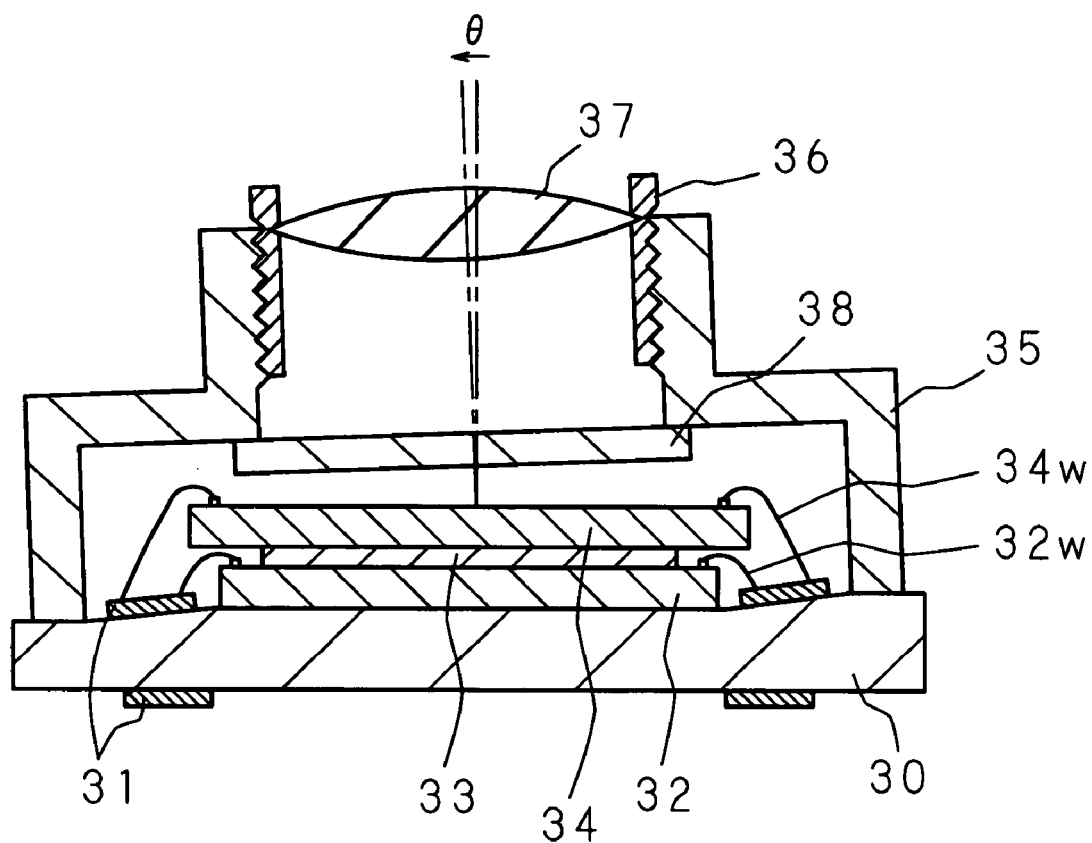
FIG. 4 is an explanatory view showing still another problem of the conventional module for optical devices.
Figure 5:
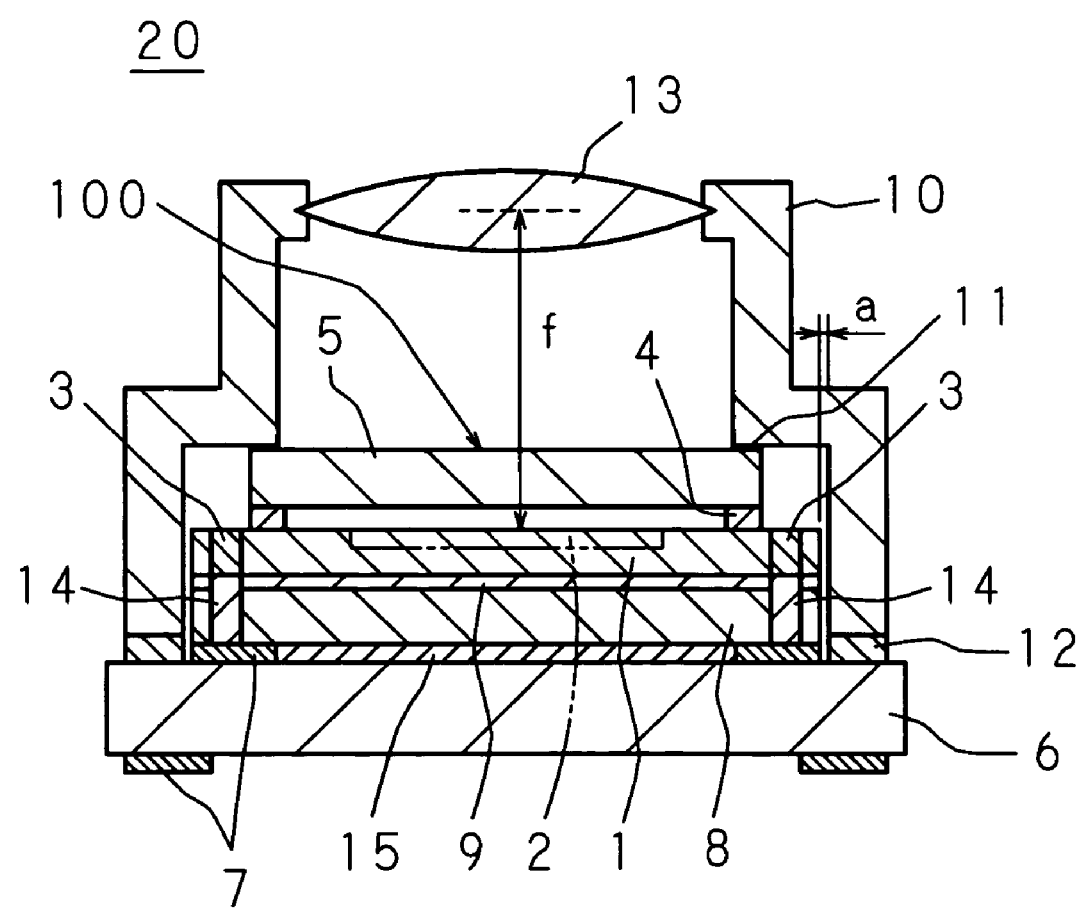
FIG. 5 is a cross sectional view showing the structure of a module for optical devices according to the present invention.
Figure 6:
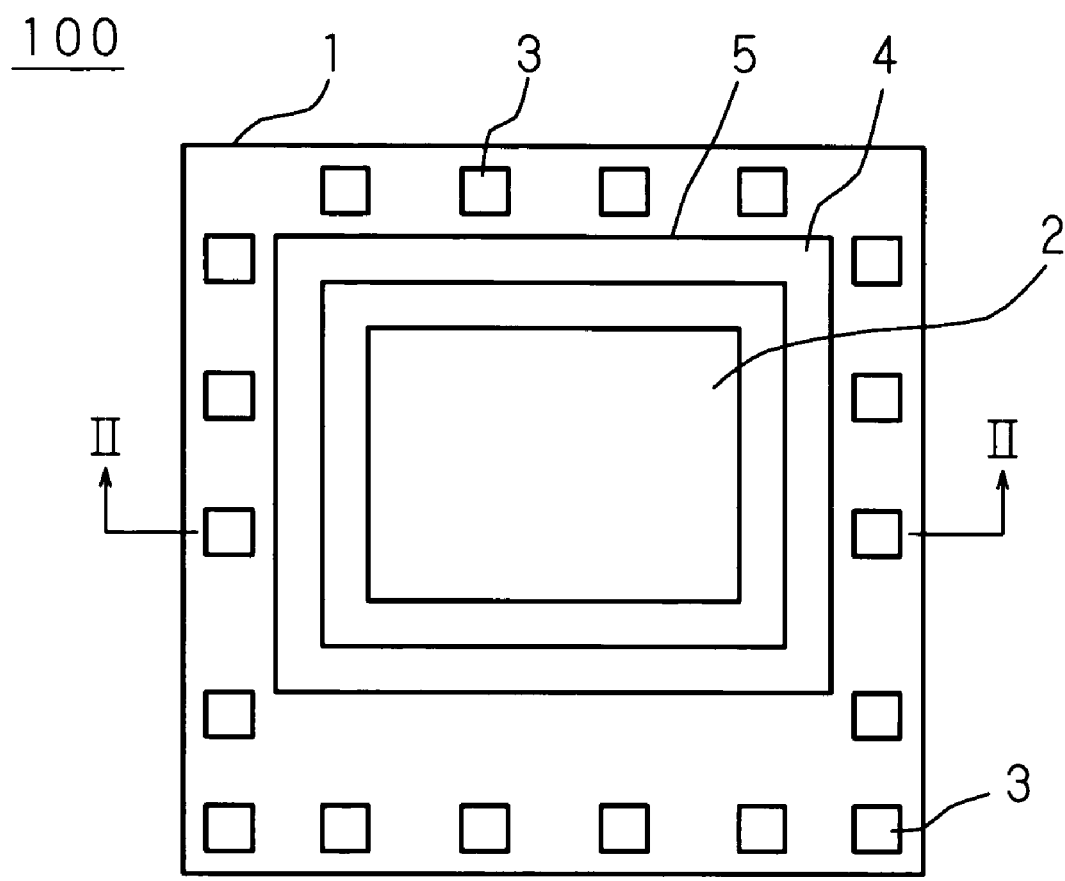
FIG. 6 is a plan view showing one structure of the image pickup part of the module for optical device according to the present invention.
Figure 7:
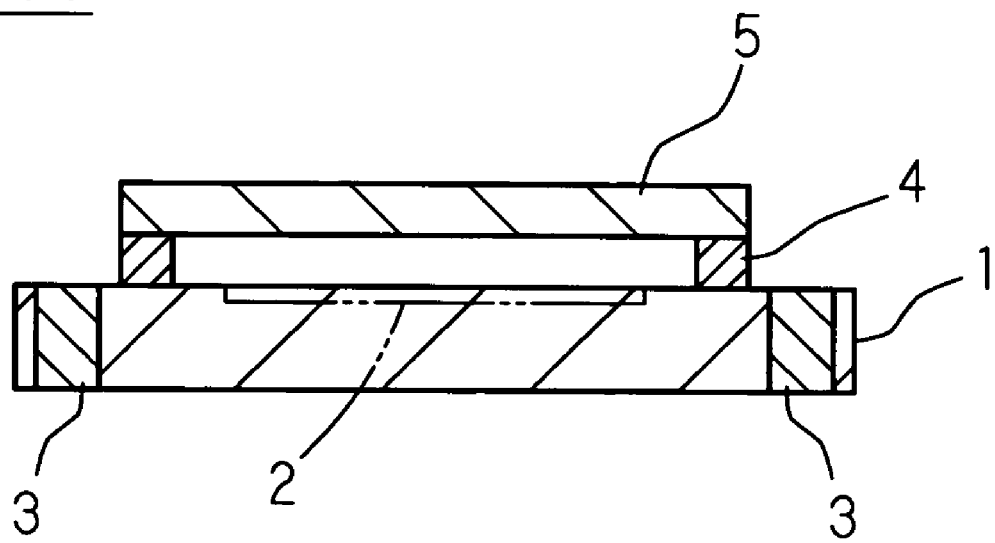
FIG. 7 is a cross sectional view showing one structure of the image pickup part of the module for optical device according to the present invention.

FIG. 5 is a cross sectional view showing the structure of a module 20 for optical devices according to the present invention. FIG. 6 is a plan view showing one structure of an image pickup part 100 of the module 20 for optical devices, and FIG. 7 is a cross sectional view along the II—II line of FIG. 6. A plan view showing the structure of the module 20 for optical devices (the plan view corresponding to FIG. 5) is omitted.

The image pickup part 100 comprises a solid-state image pickup element 1 in the form of a rectangular plate, and a translucent lid part 5 in the form of a rectangular plate stacked on the solid-state image pickup element 1 through an adhesive part 4. In the solid-state image pickup element 1, an effective pixel area 2 for performing photo-electric conversion is formed in the center portion of one surface. The one surface of the solid-state image pickup element 1 where the effective pixel area 2 is formed will be hereinafter referred to as the front surface, and the other surface will be referred to as the rear surface. Moreover, one surface of the translucent lid part 5 on the solid-state image pickup element 1 side will be referred to as the rear surface, and the other surface will be referred to as the front surface.

In the solid-state image pickup element 1, a plurality of through electrodes 3, 3, . . . passing through the solid stage image pickup element 1 are formed as connection terminals for taking out electric signals obtained by photo-electric conversion in the effective pixel area 2. The through electrodes 3, 3, . . . are formed using a conductive material, such as copper, at an appropriate distance from the effective pixel area 2 to enclose the effective pixel area 2. The through electrodes 3, 3, . . . are also separated from each other by an appropriate distance. The number and layout of the through electrodes 3, 3, . . . are set according to the necessity of wiring for the effective pixel area 2.

The translucent lid part 5 is made of a translucent material such as glass or a synthetic resin, and placed to face the effective pixel area 2 so as to cover the effective pixel area 2. Therefore, the translucent lid part 5 prevents troubles such as, for example, damage to the effective pixel area 2 due to contact with an external object. Moreover, the plane dimension (size) of the translucent lid part 5 is made smaller than the plane dimension (size) of the solid-state image pickup element 1. It is thus possible to reduce the size of the image pickup part 100 (and further the module 20 for optical devices), and particularly, if the module 20 is a camera module, it is possible to construct a small-sized camera with good portability.

The adhesive part 4 is formed using an adhesive produced by mixing a photosensitive resin and a thermosetting resin. On the front surface of the solid-state pickup element 1, the adhesive part 4 is formed on the whole periphery of the effective pixel area 2 so that it is located between the effective pixel area 2 and the formation position of the through electrodes 3, 3, . . . and separated from the effective pixel area 2 by a distance. Besides, on the rear surface of the translucent lid part 5, the adhesive part 4 is formed on the whole edge of the translucent lid part 5. Such an adhesive part 4 completely seals the periphery of the effective pixel area 2 by closing the space between the solid-state image pickup element 1 and the translucent lid part 5. Therefore, after the solid-state image pickup element 1 and the translucent lid part 5 are bonded together, it is possible to prevent defects in the effective pixel area 2 due to humidity infiltration, entry and adhesion of dust, etc. into the effective pixel area 2, thereby improving the manufacturing yield and the reliability of the solid-state image pickup element 1 (and the module 20 for optical devices).

Besides, since the adhesive part 4 is not formed in the effective pixel area 2, a space is formed between the sealed solid-state image pickup element 1 and translucent lid part 5. In other words, the adhesive part 4 is not present between the effective pixel area 2 and the translucent lid part 5. As a result, light incident on the module 20 for optical devices from outside passes through the translucent lid part 5, and reaches the effective pixel area 2 without striking the adhesive part 4 and causing a loss of light due to attenuation and scattering. The solid-state image pickup element 1 fetches the incident light into the inside and receives (detects) the light by the effective pixels (light receiving elements) placed in the effective pixel area 2. In the solid-state image pickup element 1, since the through electrode 3 electrically connects the front surface side and rear surface side of the solid-state image pickup element 1, an electrical signal obtained by photo-electric conversion in the solid-state image pickup element 1 is outputted from the solid stage image pickup element 1 through the through electrode 3.

Note that it may also be possible to form an infrared blocking film on the front surface of the translucent lid part 5 so as to provide the translucent lid part 5 with an additional function as an optical filter for blocking infrared rays incident from outside. A solid-state image pickup element 1 to which such a translucent lid part 5 is attached is suitable as a solid-state image pickup element 1 to be mounted in optical devices such as cameras and video cameras. Moreover, it may also be possible to form color filters on the translucent lid part 5.

Figure 8:
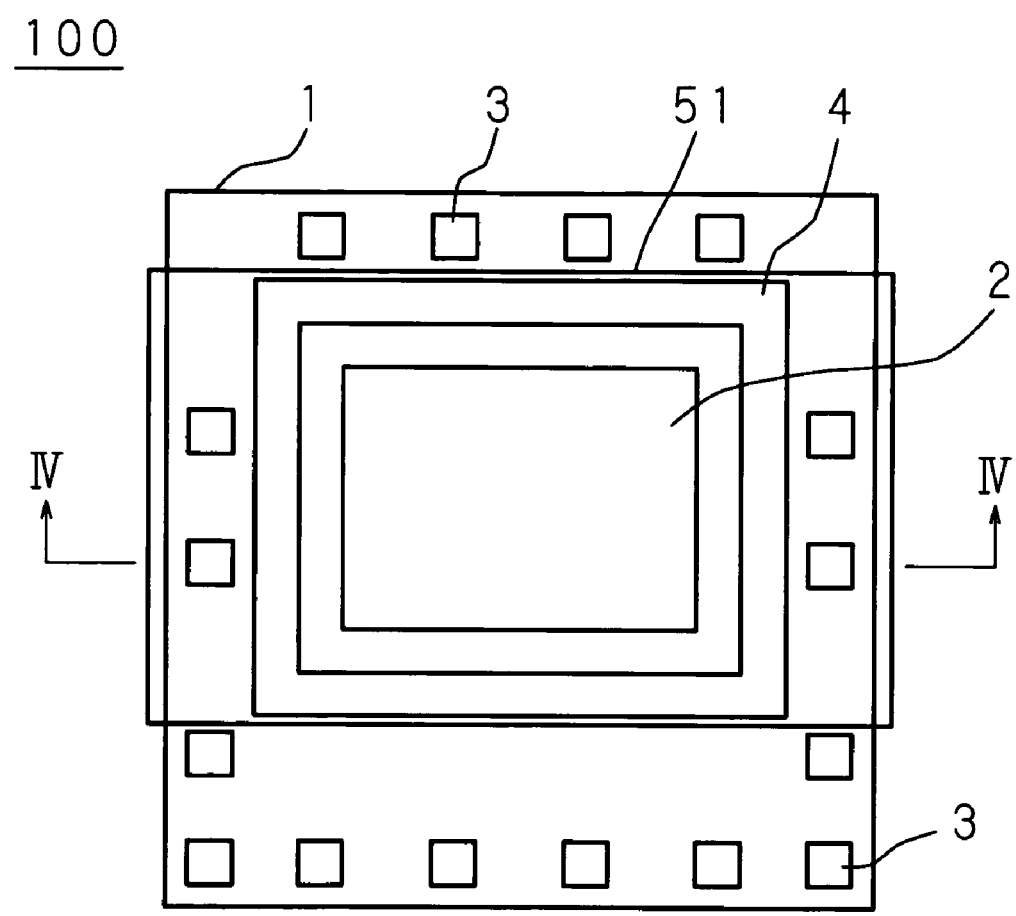
FIG. 8 is a plan view showing another structure of the image pickup part of the module for optical device according to the present invention.
Figure 9:
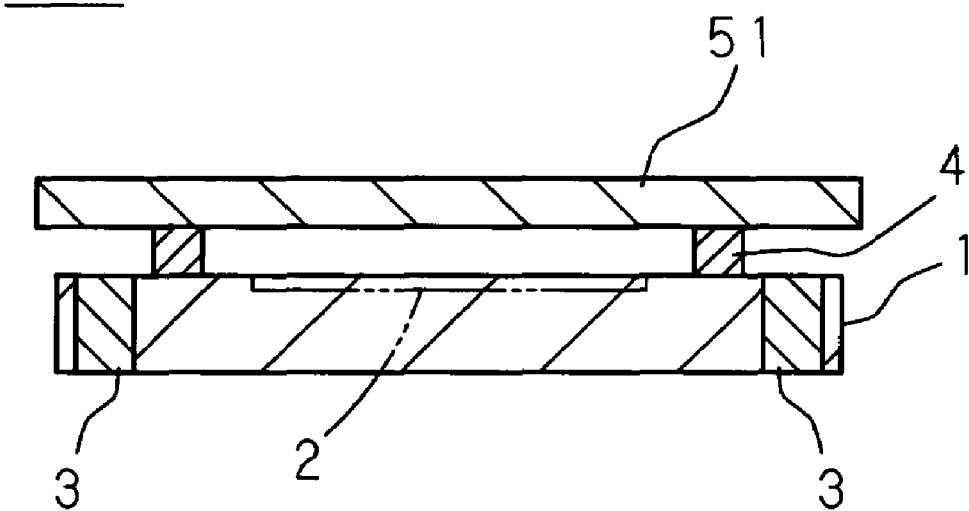
FIG. 9 is a cross sectional view showing another structure of the image pickup part of the module for optical device according to the present invention.

FIG. 8 is a plan view showing another structure of the image pickup part 100, and FIG. 9 is a cross sectional view along the IV—IV line of FIG. 8. The image pickup part 100 shown in FIG. 8 and FIG. 9 has the same structures as the image pickup part 100 shown in FIG. 6 and FIG. 7, but has a translucent lid part 51 with a greater plane size (dimension in a lateral direction in the figures) than the solid-state image pickup element 1, in place of the translucent lid part 5. Such an image pickup part 100 is used, for example, when it is necessary to attach the translucent lid part 51 with the greater plane size to the solid-state image pickup element 1. The following description will explain the module 20 for optical devices shown in FIG. 5, including the image pickup part 100 shown in FIG. 6 and FIG. 7.

In addition to the image pickup part 100, the module 20 for optical devices comprises a DSP 8 as an image processor, a wiring substrate 6, and an optical path defining unit 10 for defining an optical path to the effective pixel area 2 formed in the solid-state image pickup element 1 of the image pickup part 100. A pattern of conductor wiring 7 is formed on both surfaces of the wiring substrate 6, and the conductor wirings 7 are suitably connected to each other in the wiring substrate 6.

The DSP 8 is a semiconductor chip in the form of a plate, and a plurality of through electrodes 14, 14, . . . passing through the DSP 8 and slightly protruding from both surfaces of the DSP 8 are formed. The through electrodes 14, 14, . . . are formed using a conductive material such as copper, and the number and layout of the through electrodes 14, 14, . . . correspond to the through electrodes 3, 3, . . . and the conductor wiring 7 of the solid-state image pickup element 1. Here, for example, the protruding height of the through electrodes 14, 14, . . . is lower than the height of the bonding wire of s conventional module for optical devices. As the protruding portions of the through electrodes 14, 14, . . . , only the protruding portions on one surface on the solid-state image pickup element 1 side (hereinafter referred as the front surface of the DSP 8) are shown in FIG. 5 and FIG. 12 through FIG. 17 described later, but the protruding portions on the other surface (rear surface of the DSP 8) are not illustrated.

The rear surface of the solid-state image pickup element 1 and the front surface (flat portion) of the DSP 8 are bonded together through an adhesive part 9, and the through electrodes 3, 3, . . . of the solid-state image pickup element 1 and the through electrodes 14, 14, . . . of the DSP 8 are electrically connected. Moreover, the rear surface of the DSP 8 and one surface of the wiring substrate 6 (hereinafter referred to as the front surface of the wiring substrate 6) are bonded together through an adhesive part 15, and the through electrodes 14, 14, . . . of the DSP 8 and the conductor wiring 7 formed on the front surface of the wiring substrate 6 are electrically connected. As described above, the solid-state image pickup element 1 (and further the image pickup part 100), the DSP 8 and the wiring substrate 6 are stacked with the adhesive parts 9 and 15 therebetween.

The DSP 8 controls the operation of the solid-state image pickup element 1 as an image processor by transmitting control signals to the solid-state image pickup element 1 through the through electrodes 14, 14, . . . and the through electrodes 3, 3, . . . Moreover, the DSP 8 receives electric signals outputted through the through electrodes 3, 3, . . . by the solid-state image pickup element 1, through the through electrodes 14, 14, . . . , processes the received electric signals, and outputs the processed electric signals to the conductor wiring 7 through the through electrodes 14, 14, . . . The electric signals outputted by the DSP 8 are outputted through the through electrodes 14, 14, . . . to outside.

The optical path defining unit 10 has a cylindrical shape, and stores the DSP 8 and the image pickup part 100 therein. An opening at one end of the optical path defining unit 10 is closed by the translucent lid part 5 of the image pickup part 100 from inside, and an opening at the other end is closed from outside by the wiring substrate 6 on which the DSP 8 and the image pickup part 100 are stacked. In this case, the optical path defining unit 10 and the translucent lid part 5 are coupled together by a coupling part 11. The coupling part 11 seals the space between the optical path defining unit 10 and the translucent lid part 5 by bonding the inner wall of the optical path defining unit 10 and the edge of the front surface of the translucent lid part 5 together.

In this case, the optical path defining unit 10 and the wiring substrate 6 are coupled together with an appropriate distance therebetween through an adjustment part 12. The adjustment part 12 seals the space between the optical path defining unit 10 and the wiring substrate 6 by bonding the end of the optical path defining unit 10 and the edge of the front surface of the wiring substrate 6 with an adhesive, but has a suitable flexibility even after the adhesive is hardened. Therefore, if the wiring substrate 6 is warped or curved, or caused to be warped or curved, the adjustment part 12 automatically adjusts the distance between the end of the optical path defining unit 10 and the front surface of the wiring substrate 6. Here, the distance from the coupling part 11 to the wiring substrate 6 is longer than the distance from the coupling part 11 to the end of the optical path defining unit 10 on the adjustment part 12 side. Therefore, if the adjustment part 12 is not provided, there is a void between the end of the optical path defining unit 10 and the front surface of the wiring substrate 6. The adjustment part 12 seals this void.

Thus, since the space between the optical path defining unit 10 and the translucent lid part 5 and the space between the optical path defining unit 10 and the wiring substrate 6 are sealed, the DSP 8 and the solid-state image pickup element 1 are sealed by the optical path defining unit 10 and protected from the external environment. In other words, the optical path defining unit 10 performs the function of protecting the DSP 8 and the solid-state image pickup element 1 in addition to the optical path defining function.

Further, the optical path defining unit 10 holds a lens 13 inside the opening at one end so that the lens 13 is placed to face the effective pixel area 2 of the solid-state image pickup element 1 with the translucent lid part 5 therebetween. In short, the optical path defining unit 10 has the lens holding function. In this case, the optical length from the lens 13 to the solid-state image pickup element 1 agrees with the focal length f of the lens 13. Note that it is possible to construct the optical path defining unit 10 to also perform a shutter function.

In the module 20 for optical devices as described above, since the through electrodes 3, 3, . . . and the through electrodes 14, 14 . . . are formed in the solid-state image pickup element 1 and the DSP 8, there is no need to form a bonding wire. Therefore, it is not necessary to provide a space for a bonding wire in the stack structure of the solid-state image pickup element 1, DSP 8 and wiring substrate 6. As a result, the size of the module 20 for optical devices, for example, the distance a between the end of the solid-state image pickup element 1 and the DSP 8 is decreased. Moreover, since there is no need to provide a space for a bonding wire by interposing a spacer between the solid-state image pickup element 1 and the DSP 8, for example, the distance between the solid-state image pickup element 1 and the DSP 8 is shortened.

Further, the translucent lid part 5 bonded to the solid-state image pickup element 1 and the optical path defining unit 10 are coupled together by the coupling part 11. As a result, the module 20 for optical devices is thinner and saves space compared with a module for optical devices in which the solid-state image pickup element 1 and the translucent lid part 5 are not bonded together, or a module for optical devices in which the translucent lid part 5 and the optical path defining unit 10 are not coupled together.

Note that it may also be possible to connect the DSP 8 to the conductor wiring 7 by using a bonding wire as in a conventional example, instead of forming the through electrodes 14, 14, . . . in the DSP 8. In this case, since a bonding wire is not provided for the solid-state image pickup element 1, the resulting module 20 for optical devices is smaller than the conventional modules for optical devices. Further, it may also be possible to mount a passive part such as a resistor on the front surface of the wiring substrate 6 in addition to the DSP 8, conductor wiring 7, etc.

Figure 10A:
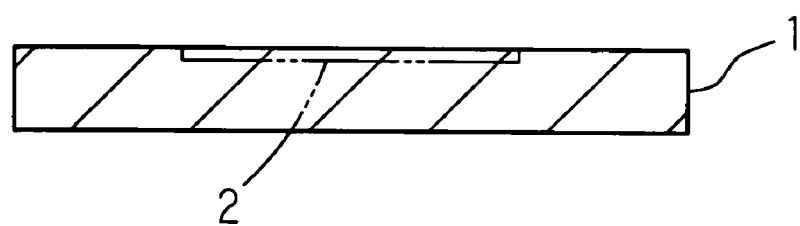
FIGS. 10A, 10B and 10C are explanatory views of a manufacturing method of the module for optical devices according to the present invention.
Figure 10B:
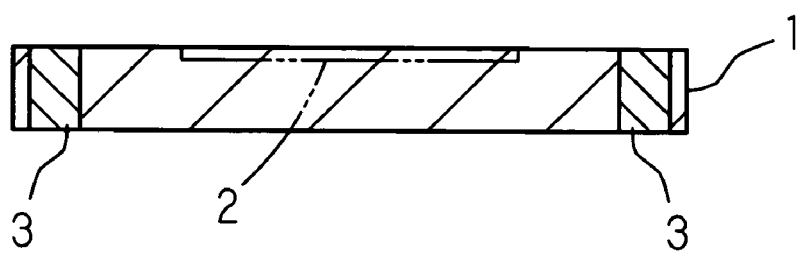
Figure 10C:
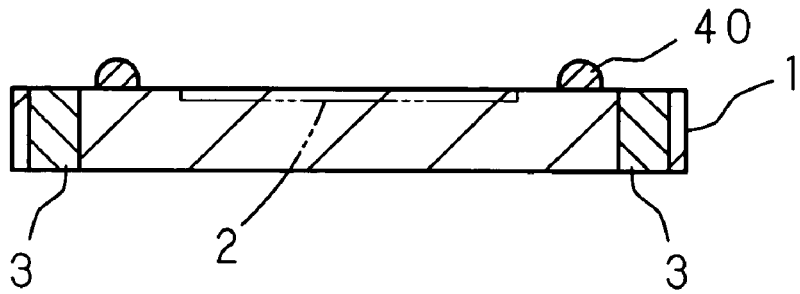

FIGS. 10A through 10C are explanatory views of a manufacturing method of a module 20 for optical devices, and show cross sections in the manufacturing process of the image pickup part 100 of the module 20 for optical devices. It may be possible to form image pickup parts 100 one by one, or it may be possible to simultaneously form a plurality of image pickup parts 100 in a semiconductor wafer. The following description will explain the manufacturing method by mainly noting the manufacturing process of one image pickup part 100.

First, an effective pixel area 2 is formed in one surface of a semiconductor substrate made of silicon to make the semiconductor substrate a solid-state image pickup element 1 (FIG. 10A). Next, through electrodes 3, 3, . . . passing through the front surface to the rear surface of the solid-state image pickup element 1 are formed in the solid-state image pickup element 1 at positions separated from the effective pixel area 2 (FIG. 10B). For example, the through electrodes 3, 3, . . . are formed by forming through holes in the solid-state image pickup element 1 and then depositing a metal material such as copper in the through holes. The deposition of the metal material is carried out by plating, or printing and hardening the metal material. It may also be possible to form the solid-state image pickup element 1 and the through electrodes 3, 3, . . . by forming non-through holes in the front surface of the semiconductor substrate thicker than the solid-state image pickup element 1, depositing the metal material in the formed holes, and then removing the semiconductor on the rear surface of the semiconductor substrate by polishing.

Further, an adhesive 40 is applied to the whole periphery of the effective pixel area 2 (FIG. 10C). The adhesive 40 is formed by applying an adhesive produced by mixing a photosensitive adhesive (for example, UV curing resin as an acryl-based resin) and a thermosetting resin (for example, epoxy-based resin) evenly on the front surface of the solid-state image pickup element 1 and then performing pattern formation (patterning) using a photolithography technique. Here, if a plurality of solid-state image pickup elements 1, 1, . . . are in the semiconductor wafer, the adhesives 40, 40, . . . are simultaneously applied to the respective solid-state image pickup elements 1, 1, . . . . Thus, the adhesives 40, 40, . . . are efficiently applied.

Finally, by placing the translucent lid part 5 on the adhesive 40 and hardening the adhesive 40 to make an adhesive part 4, the image pickup part 100 is formed (FIG. 7).

Since the adhesive produced by mixing a photosensitive adhesive with a thermosetting resin has photosensitivity, the patterning of the adhesive 40 is easily executable with high precision by performing exposure, development, etc. using a photolithography technique. As a result, even when the region other than the effective pixel area 2 in the front surface of the solid-state image pickup element 1 is narrow, the adhesive part 4 is formed with high precision. As a method for forming the adhesive part 4, there are a method in which an adhesive (for example, epoxy resin) is patterned using a printing technique, a method in which an adhesive is patterned using a dispense technique, a method using an adhesive sheet in the form of a frame, etc. in addition to the method using a photolithography technique, and it is possible to suitably select any method according to a need.

Note that it may also be possible to apply the adhesive 40 to the rear surface of the translucent lid part 5 and then bond the translucent lid part 5 having the adhesive 40 to the solid-state image pickup element 1. In this case, if a plurality of translucent lid parts 5, 5, . . . are in the state of a translucent plate material (base material of the translucent lid part 5) before cut into individual pieces, the adhesives 40, 40, . . . are efficiently applied by simultaneously applying the adhesives 40, 40, . . . to the respective translucent lid parts 5.

In this embodiment, the translucent lid part 5 is individually bonded to the solid-state image pickup element 1, but, if a plurality of solid-state image pickup elements 1, 1, . . . are in a wafer state, individual image pickup elements 100 are formed by placing the translucent plate material (base material of the translucent lid part 5) to face the solid-state image pickup elements 1, 1, . . . , bonding the solid-state image pickup elements 1, 1, . . . and the translucent plate material simultaneously, and cutting the translucent plate material according to the solid-state image pickup elements 1.

FIG. 11 through FIG. 14 are explanatory views of a manufacturing method of a module 20 for optical devices, and show a cross section in each manufacturing step of the module 20 for optical devices. In these figures, the reference numeral 21 represents a multiple wiring substrate, and the multiple wiring substrate 21 comprises wiring substrates 6, 6, . . . corresponding one-to-one with a plurality of modules 20 for optical devices, which are connected in a matrix form, a lengthy form, or other form. With the use of the multiple wiring substrate 21, it is possible to simultaneously produce the modules 20 for optical devices corresponding to the respective wiring substrates 6. In this case, the manufacturing efficiency of the modules 20, 20, . . . for optical devices is improved, and the modules 20, 20, . . . for optical devices have uniform characteristics.

The multiple wiring substrate 21 is segmented into regions corresponding to the individual wiring substrates 6 by partition lines 6a, and finally divided along the partition lines 6a and separated into the individual wiring substrates 6 (individual modules 20 for optical devices). The following description will explain the process of manufacturing a plurality of modules 20, 20, . . . for optical devices simultaneously by using the multiple wiring substrate 21. Note that it may also be possible to manufacture a module 20 for optical devices by using an initially separated individual wiring substrate 6, instead of using the multiple wiring substrate 21.

Figure 11:
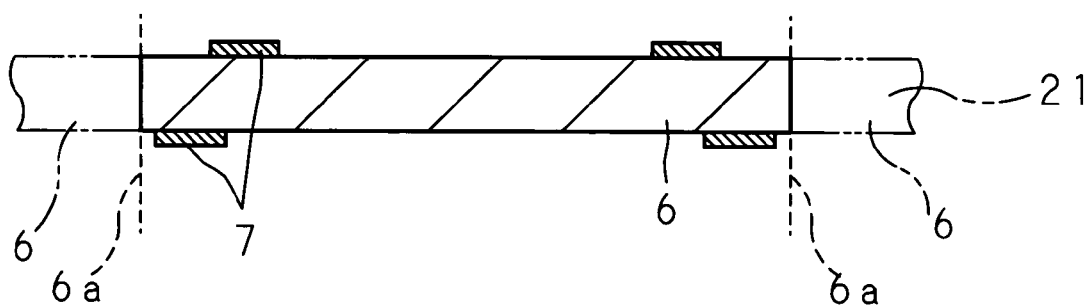
FIG. 11 is an explanatory view of a manufacturing method of the module for optical devices according to the present invention.

First, in order to maintain a mechanical strength, a ceramic substrate, a glass epoxy resin substrate, an alumina substrate, or the like with a thickness of around 0.05 to 2.00 mm is prepared as the multiple wiring substrate 21, and patterns of conductor wiring 7 corresponding to individual wiring substrates 6 are formed on both surfaces of the multiple wiring substrate 21 (FIG. 11). The conductor wiring 7 is suitably designed according to the target specification of the modules 20, 20, . . . for optical devices, and the conductor wirings 7 formed on both surfaces of one wiring substrate 6 are treated so that they are connected to each other in the wiring substrate 6 (not shown). For the other wiring substrates 6, 6, . . . , the same treatment is performed simultaneously. The following explanation is given by noting the manufacturing process of one wiring substrate 6.

Figure 12:
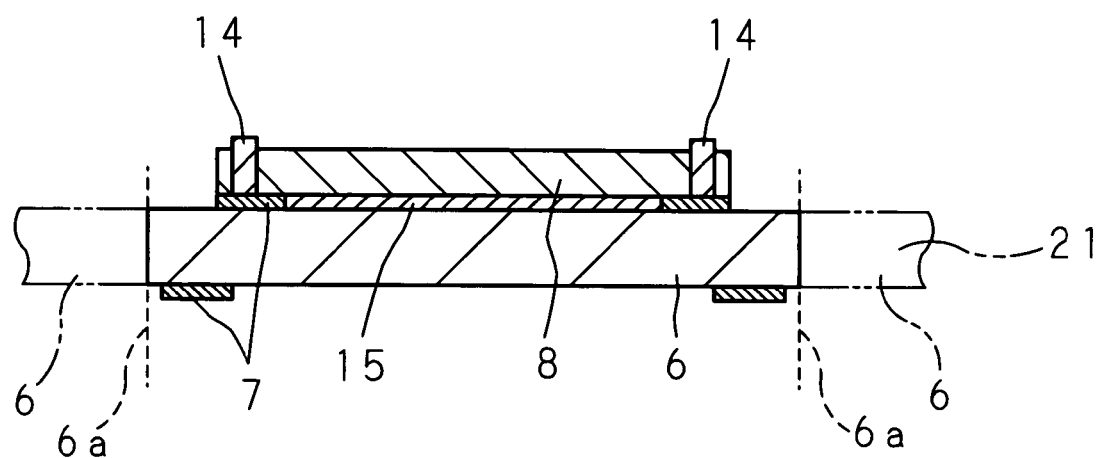
FIG. 12 is an explanatory view of a manufacturing method of the module for optical devices according to the present invention.

After forming the conductor wiring 7, the DSP 8 is stacked to the wiring substrate 6 by bonding the DSP 8 having the through electrodes 14, 14, . . . to the front surface of the wiring substrate 6 through the adhesive part 15 (FIG. 12). First, a plurality of through electrodes 14, 14, . . . protruding suitably from both surfaces are formed in the DSP 8 beforehand. Here, the protruding parts of the through electrodes 14, 14, . . . are provided so as to come into contact with and be electrically connected to the through electrodes 3, 3, . . . , or the conductor wiring 7. Note that it may also be possible to provide protruding parts on the through electrodes 3, 3, . . . and the conductor wiring 7, instead of providing the protruding parts on the through electrodes 14, 14, . . .

Next, a sheet of anisotropic conductive adhesive is placed on the front surface of the wiring substrate 6, and the DSP 8 is placed on the anisotropic conductive adhesive by aligning the positions of the through electrodes 14, 14, . . . of the DSP 8 and the conductor wiring 7 on the front surface of the wiring substrate 6. Finally, the through electrodes 14, 14, . . . and the wiring substrate 6 are brought into contact with and electrically connected to each other by applying pressure to the DSP 8 and the wiring substrate 6, and then the anisotropic conductive adhesive is hardened to form the adhesive part 15 and fasten the DSP 8 and wiring substrate 6.

Figure 13:
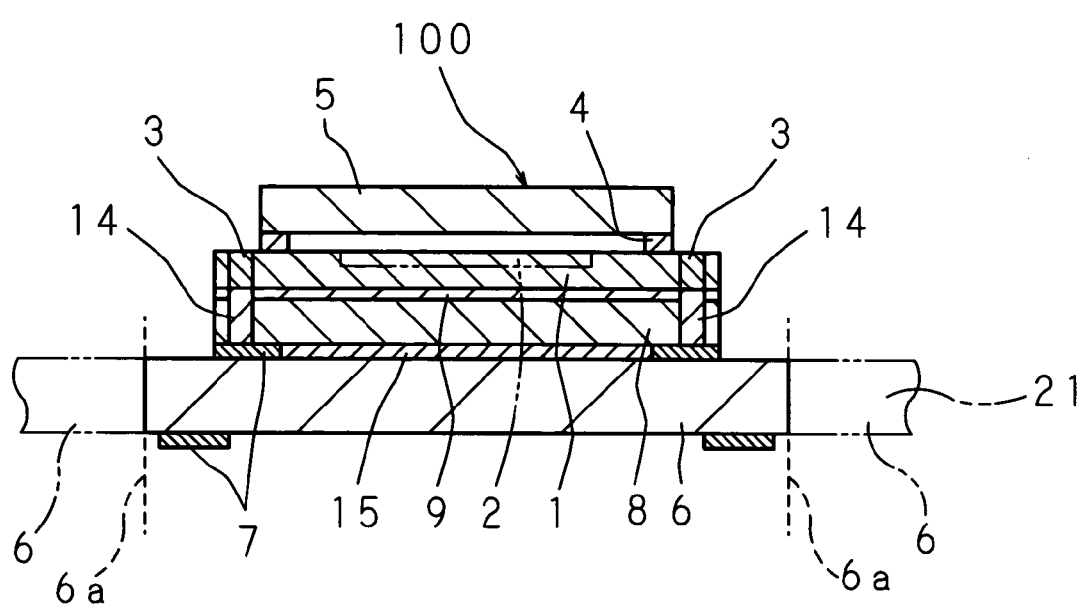
FIG. 13 is an explanatory view of a manufacturing method of the module for optical devices according to the present invention.

After mounting the DSP 8, the solid-state image pickup element 1 is mounted on the wiring substrate 6 by bonding the image pickup part 100 to the front surface of the DSP 8 through the adhesive part 9 (FIG. 13). First, a sheet of anisotropic conductive adhesive is placed on the front surface of the DSP 8, and the image pickup part 100 is placed on the anisotropic conductive adhesive by aligning the positions of the through electrodes 3, 3, . . . of the solid-state image pickup element 1 and the through electrodes 14, 14, . . . of the DSP 8. Next, the through electrodes 3, 3, . . . and the through electrodes 14, 14, . . . are brought into contact with and electrically connected to each other by applying pressure to the image pickup part 100 and the DSP 8, and then the anisotropic conductive adhesive is hardened to form the adhesive part 9 and fasten the solid-state image pickup element 1 and the DSP 8.

When mounting the solid-state image pickup element 1, the solid-state image pickup element 1 was already packaged as the image pickup part 100. Therefore, it is possible to prevent destruction of the effective pixel area 2 and adhesion of dust or the like during the manufacture of the module 20 for optical devices, and consequently the manufacturing yield of the module 20 for optical devices is improved and the reliability of the module 20 for optical devices is improved even under a production environment with low clean level. Further, since there is no need to additionally protect the effective pixel area 2, it is possible to easily manufacture the modules 20 for optical devices, thereby enabling a reduction in the manufacturing costs of the modules 20 for optical devices.

Note that if the positions of the through electrodes 14, 14, . . . of the DSP 8 and the conductor wring 7 of the wiring substrate 6 do not agree with each other, it is necessary to cause these positions to agree with each other before connecting them by rewiring at least one of them. Moreover, if the positions of the through electrodes 3, 3, . . . of the solid-state image pickup element 1 and the through electrodes 14, 14, . . . of the DSP 8 do not agree with each other, it is necessary to cause them to agree with each other before connecting them in a similar manner.

Figure 14:
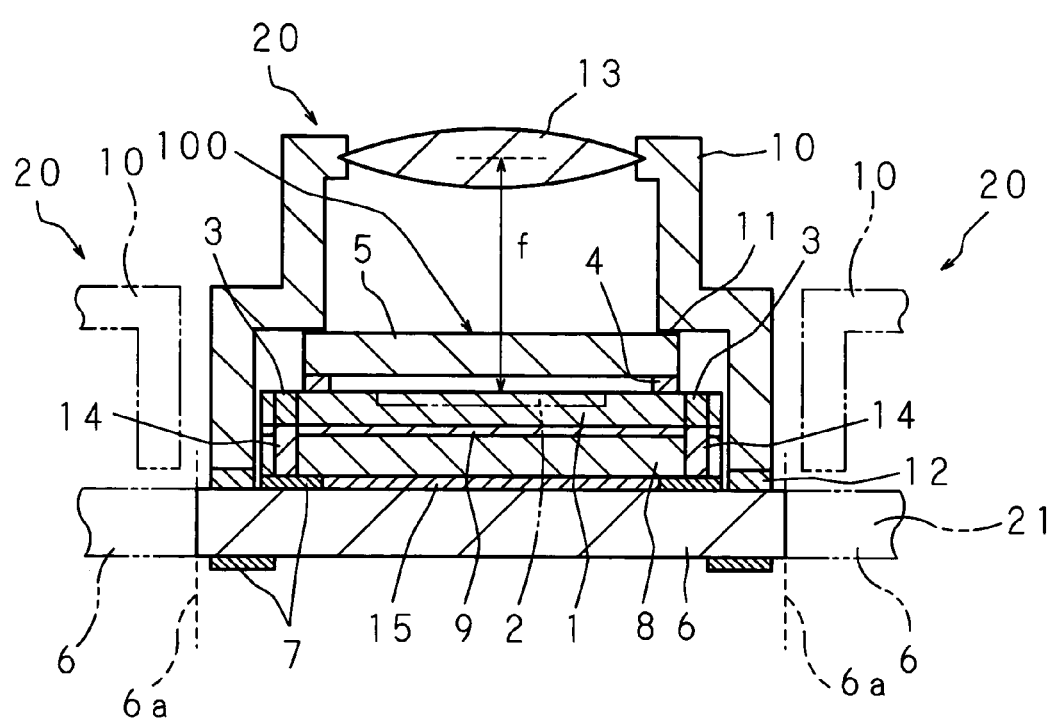
FIG. 14 is an explanatory view of a manufacturing method of the module for optical devices according to the present invention.

After mounting the solid-state image pickup element 1, an optical path defining unit 10 is attached to form the module 20 for optical devices (FIG. 14). In this case, first, a cylindrical optical path defining unit 10 with a lens 13 integrally attached to one end thereof in advance is prepared. Next, an adhesive is applied to the edge of the front surface of the translucent lid part 5, and then the front surface of the translucent lid part 5 and the inner circumference of the optical path defining unit 10 are brought into contact with each other after suitably positioning the lens 13 with respect to the translucent lid part 5. Then, the adhesive is hardened to make the coupling part 11. Here, in order to reduce the thickness of the coupling part 11, a synthetic resin (for example, an epoxy-based resin) with viscosity adjusted so that it is applied thinly to the translucent lid part 5 is used for the adhesive applied to the translucent lid part 5. Note that it may also be possible to use an adhesive sheet formed into an open square-shaped frame corresponding to the shape of the translucent lid part 5 in advance.

When the translucent lid part 5 and the optical path defining unit 10 are coupled together by the coupling part 11, the optical length from the lens 13 to the solid-state image pickup element 1 (effective pixel area 2) agrees with the focal length f of the lens 13. Moreover, a suitable void is provided between the other end of the optical path defining unit 10 and the wiring substrate 6. Therefore, an adhesive is finally poured into this void and hardened to make the adjustment part 12. Note that it may also be possible to attach the optical path defining unit 10 after applying an adhesive to both the translucent lid part 5 and the wiring substrate 6.

As described above, a plurality of modules 20 for optical devices corresponding to the respective wiring substrates 6, 6, . . . are formed in the multiple wiring substrate 21. Thereafter, the multiple wiring substrate 21 is divided (cut) into individual pieces along the partition lines 6a, 6a, . . . using a dicing, router, press mold, etc., and consequently the individual modules 20 for optical devices (FIG. 5) are formed.

In this embodiment, the distance from the coupling part 11 to the wiring substrate 6 is longer than the distance from the coupling part 11 to an end of the optical path defining unit 10 on the adjustment part 12 side. Therefore, when attaching the optical path defining unit 10, the end of the optical path defining unit 10 and the wiring substrate 6 come into contact with each other first, and the inner circumference of the optical path defining unit 10 and the translucent lid part 5 can not come into contact with or come close to each other sufficiently, thereby preventing a void, bonding failure, separation, etc. between the optical path defining unit 10 and the translucent lid part 5.

Although the wiring substrate 6 of this embodiment closes the opening of the optical path defining unit 10 from outside, it is also possible that the wiring substrate 6 may be contained in the optical path defining unit 10 and close the opening of the optical path defining unit 10 from inside. In this case, since the optical path defining unit 10 and the wiring substrate 6 do not come into contact with each other, the inner circumference of the optical path defining unit 10 and the translucent lid part 5 certainly come into contact with or come close to each other. However, if the module 20 for optical devices is mounted on a flat wiring substrate, at least the conductor wiring 7 on the rear surface of the wiring substrate 6 needs to be exposed to the outside of the optical path defining unit 10.

Moreover, in this embodiment, since the optical path defining unit 10 integrated with the lens 13 is attached, the size of the module 20 for optical devices can be made smaller compared with a module where the lens 13 and the optical path defining unit 10 are separate pieces, and the process of attaching the lens 13 to the optical path defining unit 10 can be omitted. Further, since the positioning of the lens 13 and solid-state image pickup element 1 is made simple and precise, it is possible to uniform the optical characteristics of the modules for optical devices.

As the optical path defining unit 10, instead of attaching individual optical path defining units 10 corresponding to the individual wiring substrates 6, it may be possible to attach a multiple optical path defining unit comprising a plurality of mutually connected optical path defining units 10 corresponding to the multiple wiring substrate 21 and divide it into individual pieces later. In the case where the lens 13 and the optical path defining unit 10 are separate pieces and they are assembled in a separate process, it is possible to change the specification of the lens 13 according to each module 20 for optical devices, thereby improving the flexibility of the module 20 for optical devices.

Moreover, the coupling means of the coupling part 11 is not limited to bonding, and, for example, it may be possible to mutually fit the translucent lid part 5 and the optical path defining unit 10 by screw fitting, a fitting mechanism, etc. In other words, any coupling method can be used if it can couple the translucent lid part 5 and the optical path defining unit 10 together by using (the front surface of) the translucent lid part 5 as the basis of positioning the lens 13. Besides, the optical path defining unit 10 needs to have a structure capable of holding the lens 13 and capable of being coupled to the translucent lid part 5. The module 20 for optical devices of this embodiment needs to have the optical path defining unit 10, but does not need to include a lens holder composed of an optical path defining unit and a focus adjuster as in a conventional module for optical devices. Therefore, the structure of the module 20 for optical devices is simple, and a small size (light weight) and low costs are realized.

In this embodiment, the conductor wiring 7 is formed on both surfaces of the wiring substrate 6. In this case, since a connection terminal for connecting to an external device can be taken out from the rear surface of the wiring substrate 6, the packaging density of the module 20 for optical devices is improved. Note that it may also be possible to form the conductor wiring 7 on only one surface of the wiring substrate 6.

Although the DSP 8 of this embodiment is a semiconductor chip, the DSP 8 is not necessarily limited to this, and may be a chip-size package in which a semiconductor chip is sealed with a resin. In this case, since the semiconductor chip as the main body of the DSP 8 is protected by the resin seal, it is possible to prevent destruction of the main body of the DSP 8 and adhesion of dust during the manufacture of the module 20 for optical devices, thereby improving the manufacturing yield of the module 20 for optical devices and improving the reliability of the module 20 for optical devices. Further, since there is no need to additionally protect the DSP 8, the manufacture of the module 20 for optical devices is simple. However, a module 20 for optical devices, comprising a semiconductor chip DSP 8 can be made smaller than a module 20 for optical devices, comprising a chip-size package DSP 8.

When connecting the through electrodes 14, 14, ... and the conductor wiring 7, or connecting the through electrodes 3, 3, ... and the through electrodes 14, 14, ..., it may be possible to use an insulating adhesive instead of the anisotropic conductive adhesive, but it is necessary not to leave the adhesive between the through electrodes 14, 14, ... and the conductor wiring 7 or between the through electrodes 3, 3, ... and the through electrodes 14, 14, ... so as to avoid connection failure. Moreover, instead of placing the DSP 8 or the solid-state image pickup element 1 on the adhesive on the wiring substrate 6 or the DSP 8, it may be possible to pour an adhesive into the space between the DSP 8 and the wiring substrate 6 or between the solid-state image pickup element 1 and the DSP 8 after electrically connecting the through electrodes 14, 14, ... and the conductor wiring 7, or the through electrodes 3, 3, ... and the through electrodes 14, 14, .... In this case, the adhesive to be poured may be an insulating adhesive.

Further, it may also be possible to connect the through electrodes 14, 14, ... and the conductor wiring 7, or the through electrodes 3, 3, ... and the through electrodes 14, 14, ..., by flip-chip bonding such as solder bump. In this case, the through electrodes 14, 14, ... of the DSP 8 do not need to protrude. First, a solder bump or a solder paste is formed on the through electrodes 14, 14, ..., the through electrodes 3, 3, ..., or the conductor wiring 7, and then the through electrodes 14, 14, ... and the wiring substrate 7, or the through electrodes 3, 3, ... and the through electrodes 14, 14, ... are fused and connected after positioning them with respect to each other. Finally, an adhesive is poured into the space between the through electrodes 14, 14, ... and the conductor wiring 7, or between the through electrodes 3, 3, ... and the through electrodes 14, 14, ..., and hardened to form the adhesive part 15, or the adhesive part 9. In this case, the adhesive may be an insulating adhesive.

Figure 15:
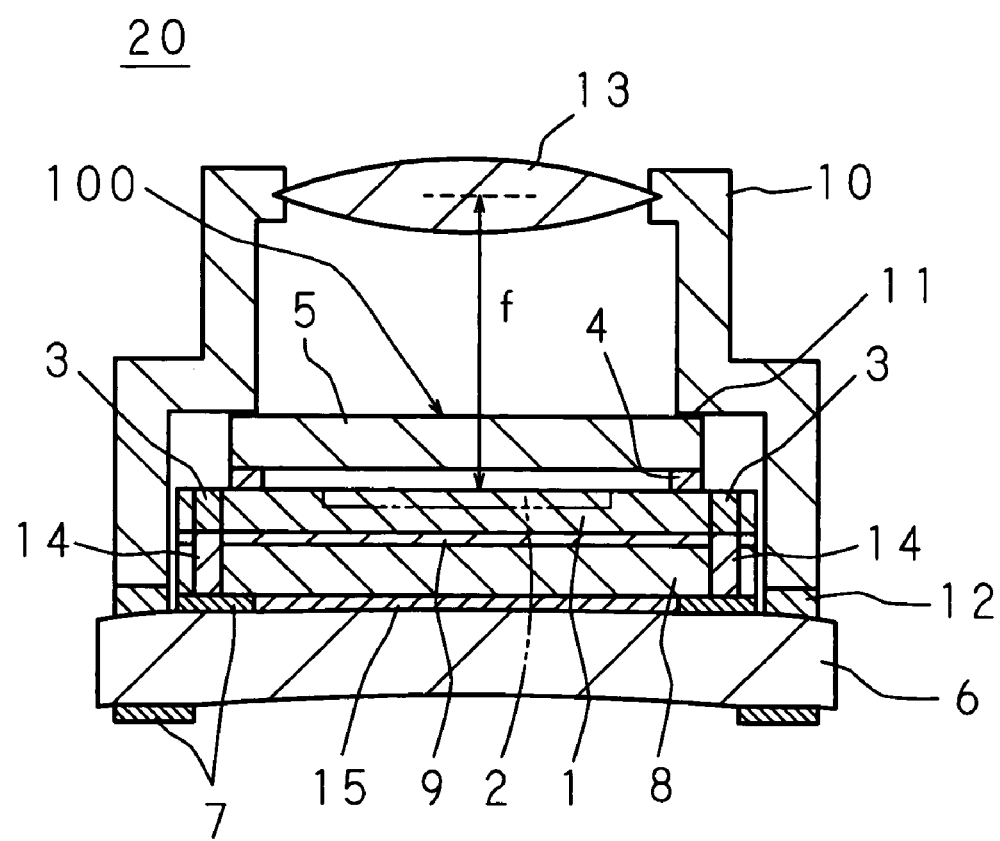
FIG. 15 is one explanatory view showing the effect of the module for optical devices according to the present invention.
Figure 16:
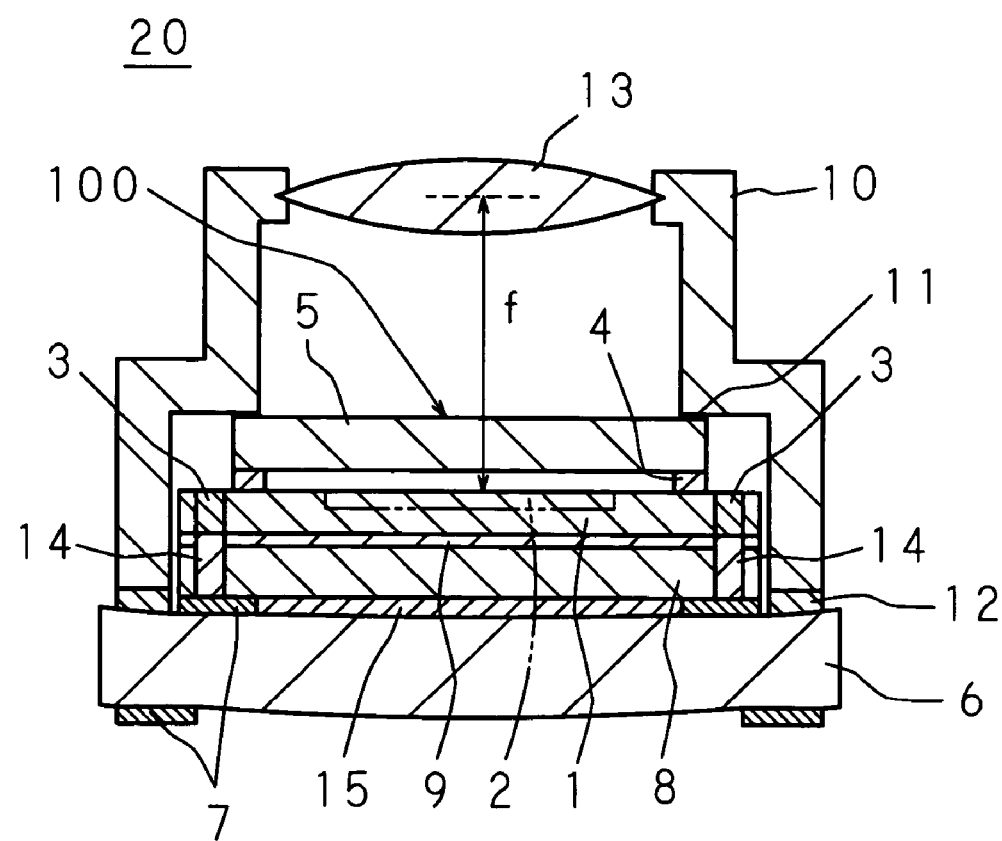
FIG. 16 is another explanatory view showing the effect of the module for optical devices according to the present invention.
Figure 17:
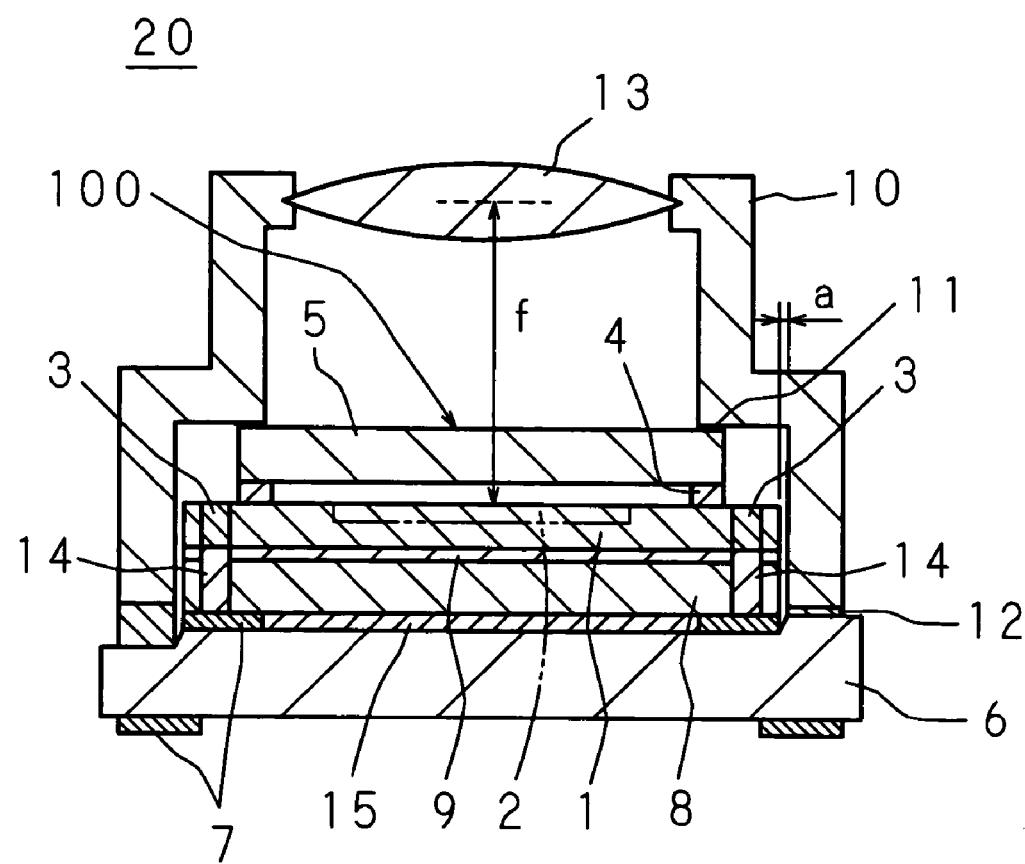
FIG. 17 is still another explanatory view showing the effect of the module for optical devices according to the present invention.

FIG. 15 through FIG. 17 are explanatory views showing the effect of the module 20 for optical devices, and show the cross sections of the module 20 for optical devices. The wiring substrate 6 shown in these figures is warped or curved, but the plate thickness of the wiring substrate 6 is within the standards.

FIG. 15 shows a state of the wiring substrate 6 in which the center portion is raised. In this case, since both ends of the wiring substrate 6 are lower than the center, the adjustment part 12 expands in the vertical direction in FIG. 15. FIG. 16 shows a state of the wiring substrate 6 in which the center portion is depressed. In this case, since both ends of the wiring substrate 6 are higher than the center, the adjustment part 12 shrinks in the vertical direction in FIG. 16. Meanwhile, in both the state shown in FIG. 15 and the state shown in FIG. 16, the translucent lid part 5 and the optical path defining unit 10 are coupled together by the coupling part 11. Therefore, the optical length between the lens 13 and the solid-state image pickup element 1 is maintained equal to the focal length f of the lens, and the lens 13 and the solid-state image pickup element 1 are held parallel to each other.

In other words, even when the wiring substrate 6 is deformed, since the position of the focal point of the lens 13 does not change, there is no need to adjust the position of the lens 13 with respect to the solid-state image pickup element 1. Moreover, the optical axis of the lens 13 and the perpendicular axis of the solid-state image pickup element 1 are aligned, and the lens 13 and the solid-state image pickup element 1 are held parallel to each other, and therefore the image of an object can be accurately projected onto the solid-state image pickup element 1.

FIG. 17 shows a case where the plate thickness of the wiring substrate 6 varies depending on locations. For example, if the wiring substrate 6 has different thicknesses at the left and right ends such that the wiring substrate 6 has a thick plate thickness at the right end and a thin plate thickness at the left end, since the left end of the wiring substrate 6 is lower than the center, the adjustment part 12 expands in the vertical direction in FIG. 17. On the other hand, since the right end of the wiring substrate 6 is higher than the center, the adjustment part 12 shrinks in the vertical direction in FIG. 17. Meanwhile, the translucent lid part 5 and the optical path defining unit 10 are coupled together by the coupling part 11. Therefore, the optical length between the lens 13 and the solid-state image pickup element 1 is maintained equal to the focal length f of the lens, and the lens 13 and the solid-state image pickup element 1 are held parallel to each other.

In other words, even when the wiring substrate 6 has different plate thicknesses depending on locations, the position of the focal point of the lens 13 does not change, and therefore there is no need to adjust the position of the lens 13 with respect to the solid-state image pickup element 1. Moreover, the optical axis of the lens 13 and the perpendicular axis of the solid-state image pickup element 1 are aligned, and the lens 13 and the solid-state image pickup element 1 are held parallel to each other, and therefore the image of the object can be accurately projected onto the solid-state image pickup element 1.

Since the adjustment part 12 expands or shrinks in the manner described above, the unevenness in the plate thickness of the wiring substrate 6, or stress caused by deformation of the wiring substrate 6, is reduced. As a result, it is possible to prevent transmission of the stress to the coupling part 11, adhesive part 4, adhesive part 9 or adhesive part 15, and prevent separation and uncoupling or detachment of the respective parts, and destruction of the module 20 for optical devices. In the case where the adjustment part 12 is a void, the unevenness in the plate thickness of the wiring substrate 6, or stress caused by deformation of the wiring substrate 6, is further reduced.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A module for optical devices, comprising:
   a solid-state image pickup element having an effective pixel area in one surface thereof,
   an optical path defining unit for defining an optical path to the effective pixel area:
   a through electrode passing through the solid-state image pickup element;
   a translucent lid part placed to face the effective pixel area;
   an adhesive part for bonding the translucent lid part to the solid-state image pickup element; and
   a coupling part for coupling the translucent lid part and the optical path defining unit together.

2. The module for optical devices according to claim 1, wherein the coupling part bonds the translucent lid part and the optical path defining unit together.

3. The module for optical devices according to claim 2, wherein the translucent lid part has a smaller plane size than a plane size of the one surface of the solid-state image pickup element.

4. The module for optical devices according to claim 2, wherein the adhesive part includes a photosensitive adhesive.

5. The module for optical devices according to claim 2, wherein a space is formed between the effective pixel area and the translucent lid part, and the adhesive part is formed on a periphery of the effective pixel area on the one surface.

6. The module for optical devices according to claim 5, wherein the adhesive part seals the periphery.

7. The module for optical devices according to claim 2, wherein the optical path defining unit holds a lens placed to face the effective pixel area.

8. The module for optical devices according to claim 2, wherein the solid-state image pickup element is bonded to a flat portion of an image processor bonded to a wiring substrate.

9. The module for optical devices according to claim 8, wherein the through electrode and a through electrode passing through the image processor are connected.

10. The module for optical devices according to claim 1, wherein the translucent lid part has a smaller plane size than a plane size of the one surface of the solid-state image pickup element.

11. The module for optical devices according to claim 1, wherein the adhesive part includes a photosensitive adhesive.

12. The module for optical devices according to claim 1, wherein a space is formed between the effective pixel area and the translucent lid part, and the adhesive part is formed on a periphery of the effective pixel area on the one surface.

13. The module for optical devices according to claim 12, wherein the adhesive part seals the periphery.

14. The module for optical devices according to claim 1, wherein the optical path defining unit holds a lens placed to face the effective pixel area.

15. The module for optical devices according to claim 1, wherein the solid-state image pickup element is bonded to a flat portion of an image processor bonded to a wiring substrate.

16. The module for optical devices according to claim 15, wherein the through electrode and a through electrode passing through the image processor are connected.

* * * * *